(12) United States Patent
Sorenson et al.

(10) Patent No.: US 10,571,267 B1
(45) Date of Patent: Feb. 25, 2020

(54) HIGH STABILITY ANGULAR SENSOR

(71) Applicant: HRL Laboratories, LLC, Malibu, CA (US)

(72) Inventors: Logan D. Sorenson, Agoura Hills, CA (US); Raviv Perahia, Agoura Hills, CA (US); David T. Chang, Calabasas, CA (US); Randall L. Kubena, Oak Park, CA (US); Deborah J. Kirby, Calabasas, CA (US); Hung Nguyen, Los Angeles, CA (US); Richard J. Joyce, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 475 days.

(21) Appl. No.: 15/253,704

(22) Filed: Aug. 31, 2016

Related U.S. Application Data (60) Provisional application No. 62/212,902, filed on Sep. 1, 2015, provisional application No. 62/321,042, filed on Apr. 11, 2016.

(51) Int. Cl.
*G01C 25/00* (2006.01)
*G01C 19/5776* (2012.01)
(Continued)

(52) U.S. Cl.
CPC ........... *G01C 19/5684* (2013.01); *H03G 3/20* (2013.01); *H03L 7/26* (2013.01)

(58) Field of Classification Search
None
See application file for complete search history.

(56) References Cited

U.S. PATENT DOCUMENTS 5,939,847 A * 8/1999 Ashizawa ............. H02N 2/142
310/316.02
6,806,784 B2 10/2004 Hollberg et al.
(Continued)

OTHER PUBLICATIONS

Title: Chip-Scale Atomic Devices—Precision Atomic Instruments Based on MEMS; URL http://ws680.nist.gov/publication/get_pdf.cfm?pub_id=901006 (Year: 2008).*
(Continued)

*Primary Examiner* — Judy Nguyen
*Assistant Examiner* — Ruben C Parco, Jr.
(74) *Attorney, Agent, or Firm* — Lewis Roca Rothgerber Christie, LLP (57) ABSTRACT

An angular rate sensor. The sensor includes a Coriolis vibratory gyroscope (CVG) resonator, configured to oscillate in a first normal mode and in a second normal mode; a frequency reference configured to generate a reference signal; and a first phase control circuit. The first phase control circuit is configured to: measure a first phase difference between: a first phase target, and the difference between: a phase of an oscillation of the first normal mode and a phase of the reference signal. The first phase control circuit is further configured to apply a first phase correction signal to the CVG resonator, to reduce the first phase difference. A second phase control circuit is similarly configured to apply a second phase correction signal to the CVG resonator, to reduce a corresponding, second phase difference.

2 Claims, 8 Drawing Sheets

(51) Int. Cl.
  *G01C 19/5684*  (2012.01)
  *H03L 7/26*  (2006.01)
  *H03G 3/20*  (2006.01)

(56) References Cited

U.S. PATENT DOCUMENTS

| | | | |
|---|---|---|---|
| 7,437,253 B2 | 10/2008 | Shcheglov et al. | |
| 8,402,824 B1 * | 3/2013 | Kubena | G01C 19/5783 73/497 |
| 9,038,459 B1 | 5/2015 | Kubena | |
| 2005/0092084 A1 * | 5/2005 | Fell | G01C 19/567 73/504.13 |
| 2014/0292425 A1 * | 10/2014 | Kozaki | H03K 19/00384 331/74 |
| 2016/0018243 A1 * | 1/2016 | Okon | G01C 25/00 73/1.77 |

OTHER PUBLICATIONS

U.S. Appl. No. 15/253,694, filed Aug. 31, 2016, Sorenson et al.

"Leading Edge Technology Enables a Chip Scale Atomic Clock", Microsemi Corporation, 2014, pp. 1-6.

Lutwak, R. et al., "The Chip-Scale Atomic Clock—Recent Development Progress", Proceedings of the 35th Annual Precise Time and Time Interval (PTTI) Systems and Applications Meeting, Dec. 2-4, 2003, pp. 467-478, San Diego, California.

Website: Quantum SA.45s Chip Scale Atomic Clock (CSAC); Microsemi Corporation http://www.microsemi.com/products/timing-synchronization-systems/embedded-timing-solutions/components/sa-34s-chip-scale-atomic-clock#overview, printed Nov. 10, 2016, (2 pages).

\* cited by examiner

HIGH STABILITY ANGULAR SENSOR

CROSS-REFERENCE TO RELATED APPLICATION(S)

The present application claims priority to and the benefit of U.S. Provisional Application No. 62/212,902, filed Sep. 1, 2015, entitled "ATOM LOCKED ANGULAR SENSOR (ATLAS) WITH HIGH RESOLUTION AND DYNAMIC RANGE MULTI-MODE GYRO (MMG) ARCHITECTURE", and priority to and the benefit of U.S. Provisional Application No. 62/321,042, filed Apr. 11, 2016, entitled "STABILIZATION OF CORIOLIS VIBRATORY GYROSCOPES BY FREQUENCY LOCKING TO ULTRA STABLE CLOCKS", the entire contents of both of which are incorporated herein by reference.

FIELD

One or more aspects of embodiments according to the present invention relate to angular sensors, and more particularly to a high stability angular sensor.

BACKGROUND

Gyroscopes may be used in a wide range of applications, including guidance of aircraft, spacecraft, missiles, and the like. A gyroscope (or "gyro") measures an angular rate, i.e., the rate at which the gyroscope rotates, about one or more axes. The output of a gyroscope may be an analog signal or a digital data stream, and it may include, along with an indication of the angular rate of the gyro, noise or errors. For example, the gyroscope may have a bias, e.g., it may indicate a non-zero angular rate when it is not rotating. The bias may vary with time, exhibiting an error referred to as bias drift. Bias drift may limit the usefulness of a gyroscope for guidance applications, especially when other sensors with better low-frequency performance are not available to complement the gyro.

Thus, there is a need for a gyroscope with reduced bias drift.

SUMMARY

According to an embodiment of the present invention there is provided an angular sensor, including: a Coriolis vibratory gyroscope (CVG) resonator, configured to oscillate in a first normal mode and in a second normal mode; a frequency reference configured to generate a reference signal; and a first phase control circuit configured to: measure a first phase difference between: a first phase target, and the difference between: a phase of an oscillation of the first normal mode and a phase of the reference signal; apply a first phase correction signal to the CVG resonator, to reduce the first phase difference; and a second phase control circuit configured to: measure a second phase difference between: a second phase target, and the difference between: a phase of an oscillation of the second normal mode and the phase of the reference signal; and apply a second phase correction signal to the CVG resonator, to reduce the second phase difference.

In one embodiment, the first phase target and the second phase target are programmable.

In one embodiment, the first normal mode and the second normal mode are nominally degenerate.

In one embodiment, the angular sensor includes a first amplitude control circuit configured to: measure a first amplitude difference between: a first amplitude target, and the amplitude of the oscillation of the first normal mode, and apply a first amplitude correction signal to the CVG resonator, to reduce the first amplitude difference.

In one embodiment, the angular sensor includes a second amplitude control circuit configured to: measure a second amplitude difference between: a second amplitude target, and the amplitude of the oscillation of the second normal mode, and apply a second amplitude correction signal to the CVG resonator, to reduce the second amplitude difference.

In one embodiment, the first amplitude target and the second amplitude target are programmable.

In one embodiment, the first amplitude target is about $\frac{1}{10}$th of the second amplitude target.

In one embodiment, the first amplitude control circuit, and the second amplitude control circuit are configured to interchange the values of the first amplitude target and the second amplitude target during operation.

In one embodiment, the first amplitude control circuit, and the second amplitude control circuit are configured to interchange the values of the first amplitude target and the second amplitude target repeatedly during operation.

In one embodiment, the frequency reference includes an atomic frequency reference.

In one embodiment, the atomic frequency reference is a rubidium clock.

In one embodiment, the atomic frequency reference is a chip-scale atomic clock (CSAC).

In one embodiment, the first phase control circuit is configured to apply a first phase correction signal to the CVG resonator by adjusting a natural frequency of the first normal mode.

In one embodiment, the first phase control circuit is configured to adjust the natural frequency of the first normal mode by applying a bias voltage to a first tuning electrode of the CVG resonator.

In one embodiment, the second phase control circuit is configured to adjust a natural frequency of the second normal mode by applying a bias voltage to a second tuning electrode of the CVG resonator.

In one embodiment, the angular sensor includes a first amplitude control circuit configured to: measure a first amplitude difference between: a first amplitude target, and the amplitude of the oscillation of the first normal mode, and apply a first amplitude correction signal to the CVG resonator, to reduce the first amplitude difference.

In one embodiment, the angular sensor includes a second amplitude control circuit configured to: measure a second amplitude difference between: a second amplitude target, and the amplitude of the oscillation of the second normal mode, and apply a second amplitude correction signal to the CVG resonator, to reduce the second amplitude difference.

In one embodiment, the first amplitude target and the second amplitude target are programmable.

In one embodiment, the first amplitude target is about $\frac{1}{10}$th of the second amplitude target.

In one embodiment, the first amplitude control circuit, and the second amplitude control circuit are configured to interchange the values of the first amplitude target and the second amplitude target during operation.

In one embodiment, the angular sensor includes: a plurality of the angular sensors, configured to share a common frequency reference.

According to an embodiment of the present invention there is provided a method for operating an angular sensor a including a Coriolis vibratory gyroscope (CVG) resonator, configured to oscillate in a first normal mode and in a second normal mode and a frequency reference configured to generate a reference signal, the method including: measuring a first phase difference between: a first phase target, and the difference between: a phase of an oscillation of the first normal mode and a phase of the reference signal; applying a first phase correction signal to the CVG resonator, to reduce the first phase difference; and measuring a second phase difference between: a second phase target, and the difference between: a phase of an oscillation of the second normal mode and the phase of the reference signal; and applying a second phase correction signal to the CVG resonator, to reduce the second phase difference.

According to an embodiment of the present invention there is provided a acceleration and/or magnetic sensor, including: an acceleration or magnetic field sensitive MEMS resonator, configured to oscillate in at least a first normal mode; a frequency reference configured to generate a reference signal; and at least a first phase control circuit configured to: measure a first phase difference between: a first phase target, and the difference between: a phase of an oscillation of the first normal mode and a phase of the reference signal; and apply a first natural frequency control signal to the MEMS resonator, to reduce the first phase difference.

In one embodiment, the first phase target is programmable.

In one embodiment, the natural frequency control signal is a bias voltage on a first tuning electrode of the MEMS resonator.

In one embodiment, a sensor cluster includes a plurality of the sensors, configured to share a common frequency reference.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a high stability angular sensor provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
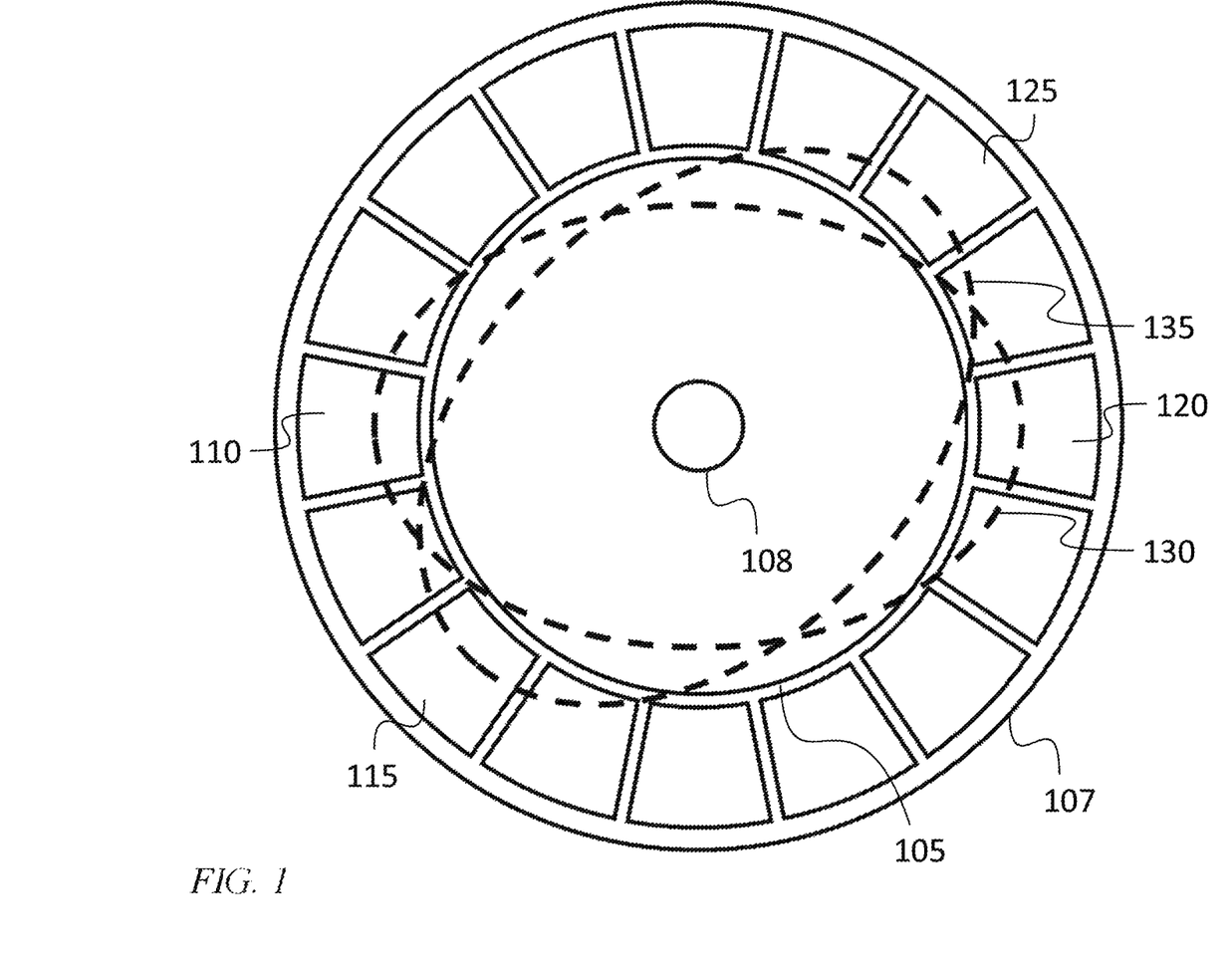
FIG. 1 is an illustration of a Coriolis vibratory gyroscope (CVG) resonator, according to an embodiment of the present invention.

Referring to FIG. 1, in one embodiment a disk resonator gyroscope (DRG) or other Coriolis vibratory gyroscope (CVG) may include a resonator such as a disk 105, with a plurality of resonator electrodes, and a case or substrate 107 that may include a plurality of housing electrodes, each in proximity with a corresponding resonator electrode. The disk 105 may be secured by an anchor 108. The pairs of corresponding electrodes (one electrode of each pair being a resonator electrode, and the other being a corresponding housing electrode) may be parallel and have substantially the same size and shape, and each pair of corresponding electrodes may form a parallel plate capacitor. The application of a first voltage to a resonator electrode and of a second voltage to a corresponding housing electrode may result in a potential difference between the two electrodes and an electric field in the region between the electrodes. Opposite charges on the surfaces of the two electrodes may attract, so that an attractive force is exerted on the resonator electrode by the housing electrode. If the voltage varies with time, then the attractive force may vary with time, and, for example, a time-varying force applied at a drive frequency near the frequency of a first normal mode of the resonator may cause the resonator oscillate in the first mode, i.e., to deform, with relatively large amplitude, at the drive frequency, in motion corresponding to the shape of the first normal mode.

Pairs of electrodes may also be used to detect the displacement of a portion of the resonator with respect to the housing. For example, if a DC voltage is applied to a pair of electrodes, then the change in capacitance resulting from a change in separation between the electrodes may cause a current to flow onto one electrode of the pair and an equal current to flow away from the other electrode of the pair. Such a current may be amplified, for example, with a transimpedance amplifier (TIA).

For example, as illustrated in FIG. 1, the resonator may have 16 electrodes including a first drive electrode 110, a second drive electrode 115, a first sense electrode 120, and a second sense electrode 125. A first n=2 mode having a first mode shape 130 may be driven by the first drive electrode 110 and sensed by the first sense electrode 120, and a second n=2 mode having a second mode shape 135 may be driven by the second drive electrode 115 and sensed by the second sense electrode 125. In some embodiments more than one electrode may be driven simultaneously or concurrently to drive a particular mode, and/or more than one electrode may be sensed simultaneously or concurrently to sense displacement in a particular mode.

If the first mode of the resonator is driven and the resonator is rotated (e.g., about an axis perpendicular to the disk, in the case of the disk-shaped resonator), the mechanical energy in the driven first normal mode may couple into a second normal mode having the same mode number and a mode shape that is rotated, e.g., by 45 degrees, relative to the mode shape of the first mode. The rate of coupling may be proportional to the rate of rotation.

The first and second normal modes may be nominally degenerate, e.g., in a disk resonator they may correspond to modes that would be perfectly degenerate (i.e., that would have the same natural frequency) if the disk resonator shape, material, and boundary conditions had perfect cylindrical symmetry. The natural frequencies of the first and second normal modes may differ, because, for example, the disk resonator may not be perfectly circular.

The attractive force due to a potential difference across the two electrodes may also vary with the separation of the electrodes, e.g., due to fringing fields at the edges of the electrodes and because, if the potential difference is constant, the change in capacitance with separation may result in a change in the charge on the electrodes. This variation in force with distance may have the effect of an additional (negative) spring force superimposed on the mechanical internal restoring force of the resonator, so that a DC voltage applied to any pair of electrodes may affect (e.g., lower) the natural frequency of the first and/or second normal mode.

If a gyroscope is operated as described above, with the first normal mode being driven, and the coupling of energy into the second normal mode used as a measure of the rotation of the gyro, then the bias of the gyroscope may have a term that is proportional to the variation of the drive frequency (from a nominal frequency). The gyroscope bias uncertainty term may be derived from the Allan deviation of the gyroscope rate output as:

$$B(\tau) = \sigma_\Omega(\tau) = \frac{90}{k}\frac{2f\sigma_y(\tau)}{Q}$$

with $$2f\sigma_y(\tau) \approx \Delta f$$

where $B(\tau)$ is the gyroscope bias instability, k is the gyroscope scale factor (angular gain), f is the drive frequency, and $\sigma_y(\tau)$ is the Allan deviation or instability of the fractional frequency of the drive frequency. Since the two normal modes are both driven by f, the instability of the residual frequency split between them will be bounded by $\Delta f \approx 2f\sigma_y(\tau)$, where the factor of 2 accounts for the instability of each normal mode. As such, a system employing a stable drive frequency may exhibit a stable bias.

Figure 2:
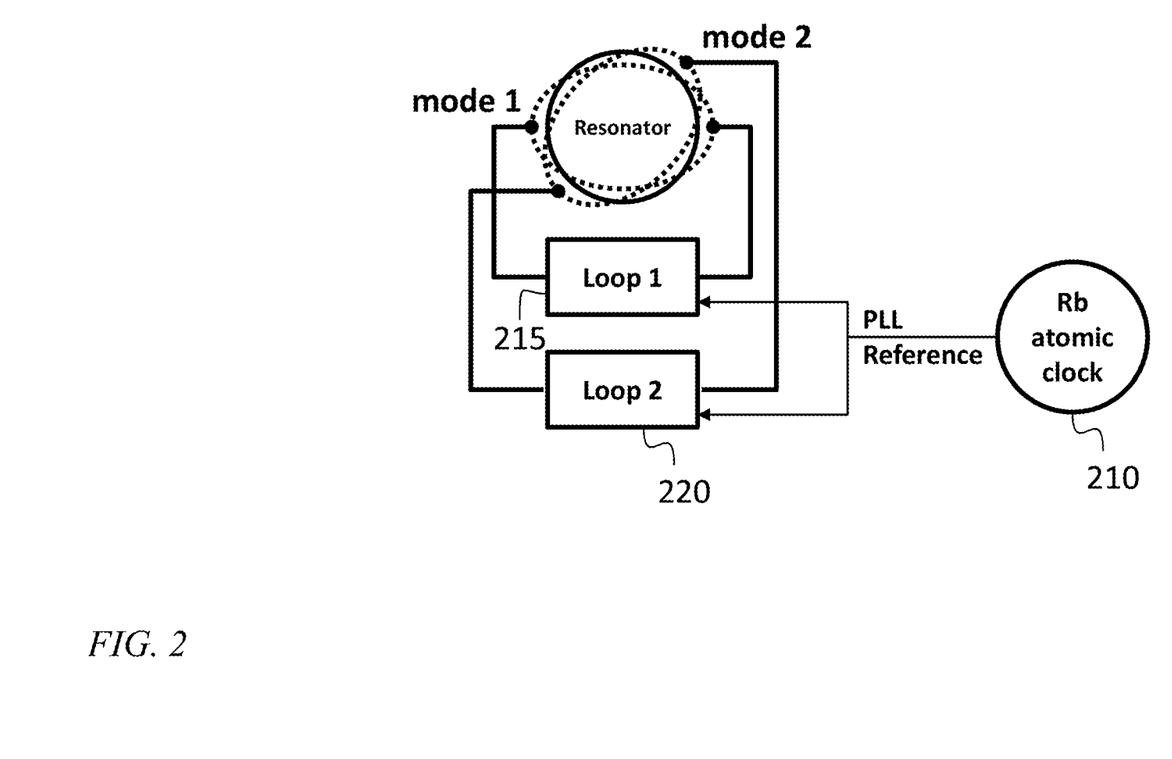
FIG. 2 is a block diagram of a high stability angular sensor, according to an embodiment of the present invention.

Accordingly, in one embodiment, a highly stable frequency reference 210 is used in a gyroscope system as illustrated in FIG. 2, to achieve high bias stability. Two amplitude and phase control loops 215, 220 control the amplitude and phase of the first and second mode of the DRG, respectively. In some embodiments, the first stable frequency reference 210 is shared by multiple sensor systems, e.g., it is shared by three gyroscopes that are combined to form a three-axis gyroscope.

Figure 3:
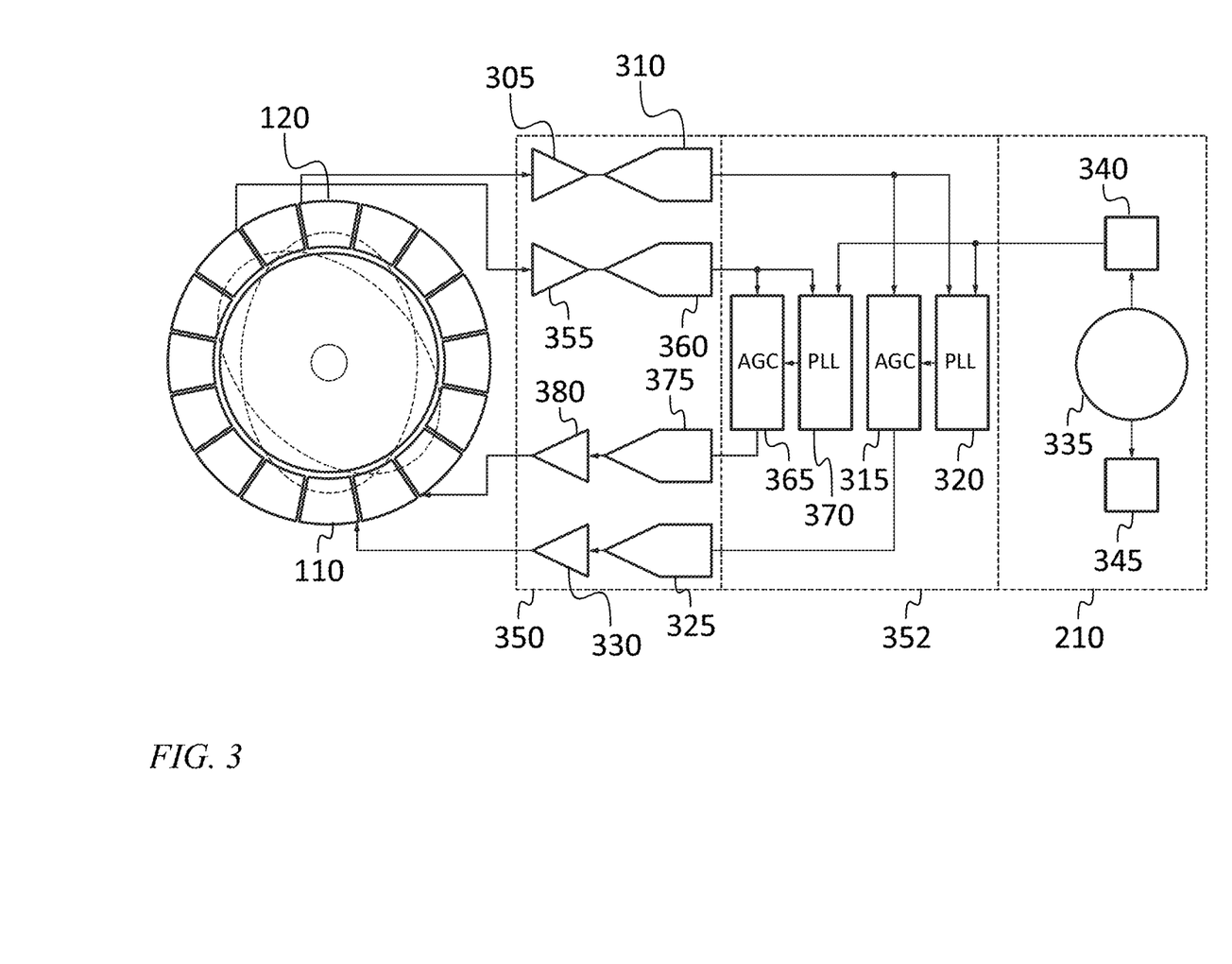
FIG. 3 is a detailed block diagram of the high stability angular sensor of FIG. 2.

Referring to FIG. 3, in one embodiment the resonator may be outfitted with a first sense electrode 120 and a first drive electrode 110, coupled to the first mode of the resonator. The first control loop may include a first transimpedance amplifier (TIA) 305 connected to the first sense electrode 120, a first analog to digital converter 310, a first automatic gain control block 315, a first phase locked loop block 320, a first digital to analog converter 325, and a first driver 330. The first transimpedance amplifier 305 (TIA), the first analog to digital converter 310, the first digital to analog converter 325, and the first driver 330 may be part of a digital to analog conversion and analog signal conditioning circuit 350. The first automatic gain control block 315 and the first phase locked loop block 320 may be part of a digital control and synthesis circuit 352, which may be an entirely digital circuit, implemented, for example, in a field-programmable gate array (FPGA). The frequency reference may include a first stable frequency reference 335 (such as a rubidium atomic clock, or a chip-scale atomic clock such as the system described in the following publication: R. Lutwak, et al. "The Chip-Scale Atomic Clock-Recent Development Progress", *Proceedings of the 35$^{th}$ Annual Precise Time and Time Interval (PTTI) Systems and Applications Meeting*, Dec. 2-4, 2003, San Diego, Calif., pp. 467-478), operating at a relatively high internal frequency, e.g., 10 MHz. A frequency divider 340 may divide the frequency down to a frequency, at the output of the frequency reference 210, that is near the natural frequencies of the first and second normal modes, e.g., 20 kHz. The frequency reference 210 may also include a reference voltage generator 345. In operation, the first mode may, in response to drive signals applied by the first control loop, oscillate at the frequency reference output frequency, e.g., 20 kHz. In one embodiment, the first TIA 305 generates a signal proportional to the displacement of the disk in the first mode, and the first analog to digital converter 310 generates from it a digital data stream representing the displacement of the disk in the first mode. The first automatic gain control block 315 measures the amplitude of the motion, compares it to a target (or "setpoint") value (e.g., a pre-programmed operating amplitude), generates an amplitude error signal proportional to the difference between the amplitude of the motion and the target, and generates an amplitude correction signal from the amplitude error signal. The amplitude correction signal may be generated, for example, by processing the amplitude error signal with a loop filter and a proportional-integral-differential (PID) controller. In some embodiments, the loop filter follows a demodulator (in the phase detector or amplitude detector) to set the loop bandwidth, and the loop filter may be considered as part of the detector. The loop filter is then followed by one or more additional elements, such as a PID controller or other controller to generate the control signal from the error signal.

In a parallel path, the output from the first analog to digital converter 310 may also be processed by the first phase locked loop block 320 to measure the phase error of the displacement of the DRG in the first mode, and to generate a corresponding correction signal and sinusoidal drive signal. For example, the first phase locked loop block 320 may control the phase of the displacement of the disk in the first mode to be substantially in phase with the frequency reference output signal as follows. The first phase locked loop block 320 may generate a phase-shifted signal 90 degrees out of phase with frequency reference output signal, may multiply this phase-shifted signal with the measured displacement in the first mode, and may process the result with a low-pass filter. The DC component of the product of the measured displacement and the phase-shifted sinusoidal signal will be zero if the measured displacement in the first mode is perfectly in phase with the frequency reference output signal, and it will be non-zero and proportional to the phase error (for a small phase error) when the measured displacement in the first mode is not perfectly in phase with the frequency reference output signal. In other embodiments, the relative phase of the measured displacement in the first mode and the frequency reference output signal may be measured using other methods, e.g., by fitting each with a linear combination of a sine function and a cosine function. A phase error may then be calculated by taking the difference between (i) the phase difference between the measured displacement in the first mode and the frequency reference output signal and (ii) a first phase target (i.e., a target phase difference or "phase setpoint"). Once a phase error has been calculated, a phase correction signal may be generated from the phase error by processing the phase error with a PID controller (or with a loop filter and then a PID controller), either in the phase locked loop block 320 or in the first automatic gain control block 315.

The automatic gain control block 315 may then generate a digital drive signal, that tends to reduce the amplitude error and the phase error, from the amplitude correction signal, the phase correction signal, the phase-shifted signal and the frequency reference output signal. This drive signal may have an amplitude proportional to the amplitude correction signal (or proportional to the amplitude correction signal plus a constant offset) and a phase set by the phase correction signal. For example, when the phase error is zero, the phase of the drive signal may be zero (i.e., it may produce a force that leads the displacement by 90 degrees), and when the phase error is not zero, the phase of the drive signal may be proportional to the phase correction signal. Similarly, the amplitude of the drive signal, when the amplitude error is zero, may be just sufficient to counteract mechanical loss in the resonator, so that the amplitude of the motion in the first mode remains constant. When the amplitude correction signal is positive, the amplitude of the drive signal may be greater, and when the amplitude correction signal is negative, the amplitude of the drive signal may be smaller. The drive signal may be applied to the first drive electrode 110, to produce a corresponding force on the resonator.

The second control loop may similarly include a second transimpedance amplifier (TIA) 355, a second analog to digital converter 360, a second automatic gain control block 365, a second phase locked loop block 370, a second digital to analog converter 375, and a second driver 380. The amplitude and phase of the displacement in the second mode may be controlled in an analogous manner to have a particular amplitude, and a particular phase relative to the output of the frequency reference 210. In one embodiment the second mode is controlled to oscillate with a phase that is 90 degrees different from that of the first mode (i.e., the oscillation of the second mode is locked to a second phase target that differs by 90 degrees from the first phase target), and with an amplitude that is about 10% of that of the first mode. When the DRG rotates, energy couples from the first mode into the second mode with a phase that is 90 degrees out of phase with the nominal oscillation of the second mode, resulting in a phase error in the second mode that is then suppressed by the second control loop. The rate of rotation may then be inferred from the phase error signal or by the phase correction signal in the second loop. In one embodiment the first and second phase targets, and the first and second amplitude targets can be individually set, e.g., they are programmable. In some embodiments, the first and second amplitude targets may be changed in real time, i.e., during operation, and the gyroscope may be operated in a mode in which they are periodically interchanged, i.e., during alternating first and second time intervals either the second amplitude target is about 10% of the first, or the first amplitude target is about 10% of the second, so that each amplitude target alternates periodically between the first and second values.

Figure 4:
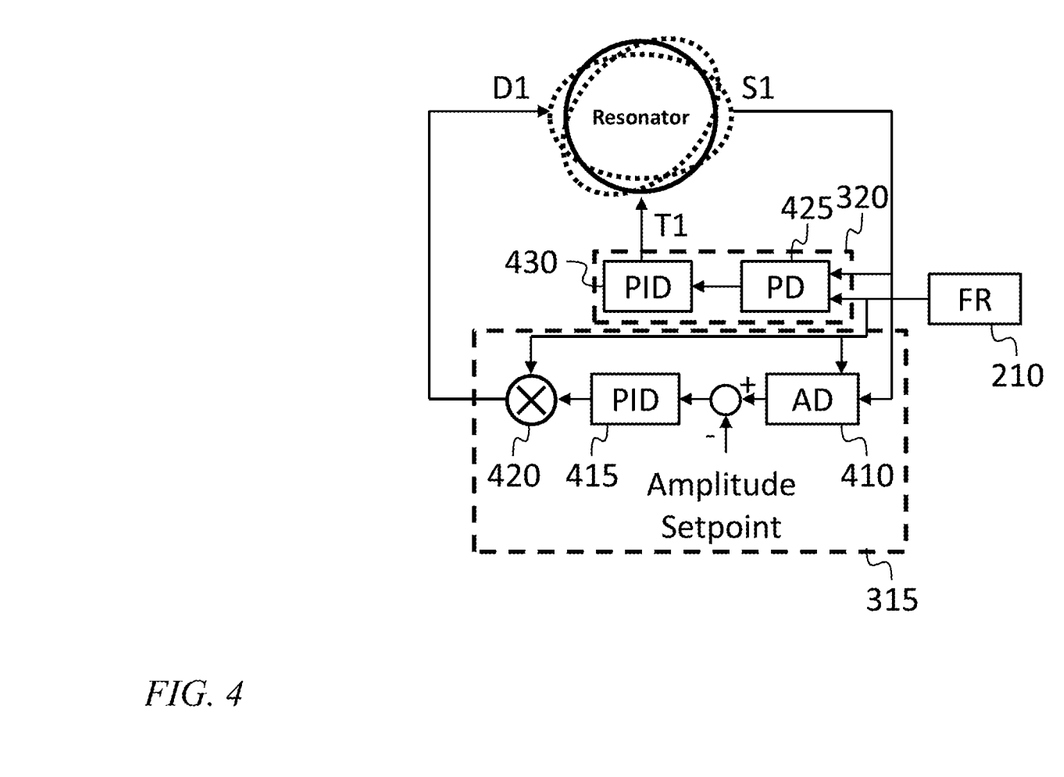
FIG. 4 is a block diagram of a high stability angular sensor, according to another embodiment of the present invention.

In another embodiment, shown in FIG. 4, the signal used to drive the first mode has a constant phase (e.g., zero degrees) with respect to the output of the frequency reference 210, and the amplitude of the oscillations in the first mode is controlled by an automatic gain control circuit (AGC) that detects the amplitude of the signal at a sense electrode S1 with an amplitude detector 410 (which may include a demodulator and a low-pass filter), processes the output with a PID controller 415, and drives the drive electrode D1 with the output of a multiplier 420 which generates the product of the PID controller output target amplitude and the AC signal from frequency reference 210, the input to which is the signal from the output of the frequency reference 210. In one embodiment the amplitude detector has a demodulator (fed by the frequency reference 210, as shown in FIG. 4) followed by a low pass loop filter and the PID controller 430. The demodulator may be driven off the frequency reference. In other embodiments the amplitude detector 410 may not require a frequency reference and the connection (shown in FIG. 4) from the frequency reference 210 may be absent. Phase control in the embodiment of FIG. 4 is accomplished by tuning the natural frequency of the first normal mode by applying a slowing varying feedback signal (or "bias voltage") to the tuning electrode T1. This feedback signal is generated by measuring, with a phase detector 425, the phase difference between the output of the frequency reference 210 and the signal at the sense electrode S1, and processing the phase error with a PID controller 430.

A similar circuit (duplicate of 430, 425, 410, and 415 and not shown in FIG. 4, for clarity) may control the amplitude and phase of the second normal mode. In one embodiment the amplitude of the second normal mode is controlled (by suitable selection of the second amplitude target) to be less than that of the first normal mode (e.g., $\frac{1}{10}^{th}$ of that of the first normal mode), and the phase is controlled (e.g., by phase shifting the signal from the frequency reference 210) to be 90 degrees out of phase with that of the first normal mode.

Figures 5A, 5B:
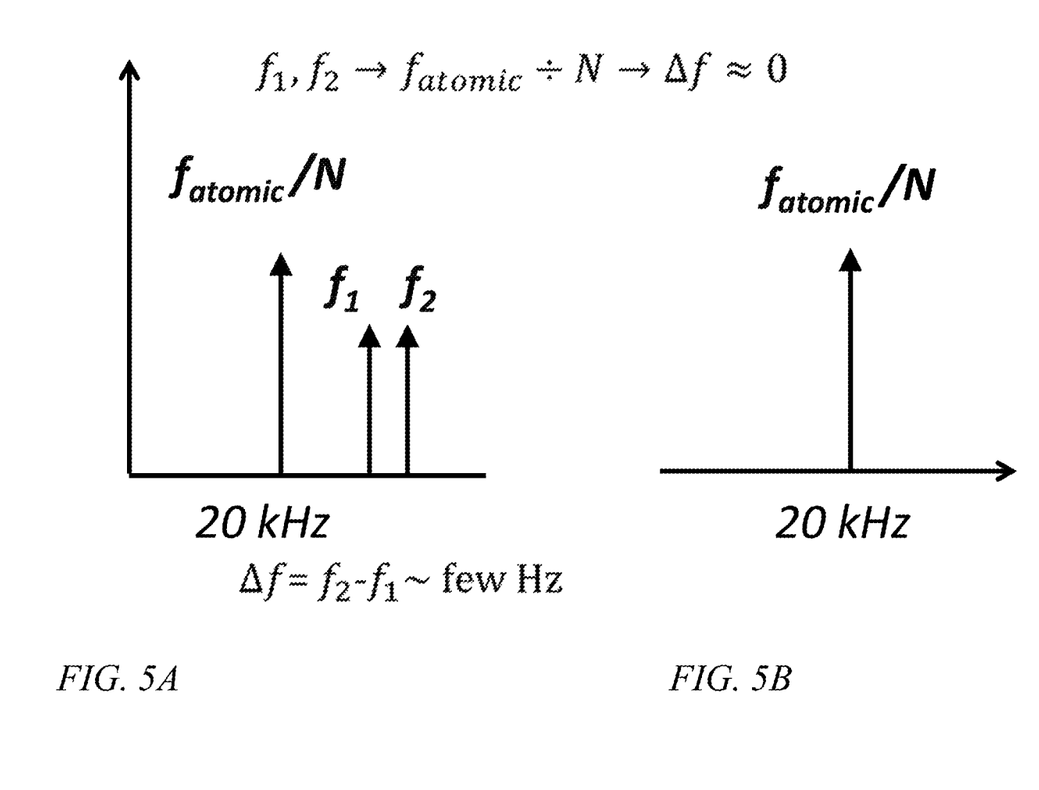
FIG. 5A is a frequency diagram of an angular sensor, according to an embodiment of the present invention.
FIG. 5B is a frequency diagram of an angular sensor, according to an embodiment of the present invention.

FIG. 5A shows an example of the natural frequencies of the first and second normal modes in embodiments in which these natural frequencies are not controlled. In the embodiment of FIG. 4, using an external frequency to tune the natural frequencies of the first and second normal modes by phase locking as described above, results in both natural frequencies being controlled (by the application of respective tuning voltages) to be the same as the frequency at the output of the frequency reference 210, as illustrated in FIG. 5B, and to be correspondingly stable. This may result in stable bias, i.e., in low bias drift.

Figure 6:
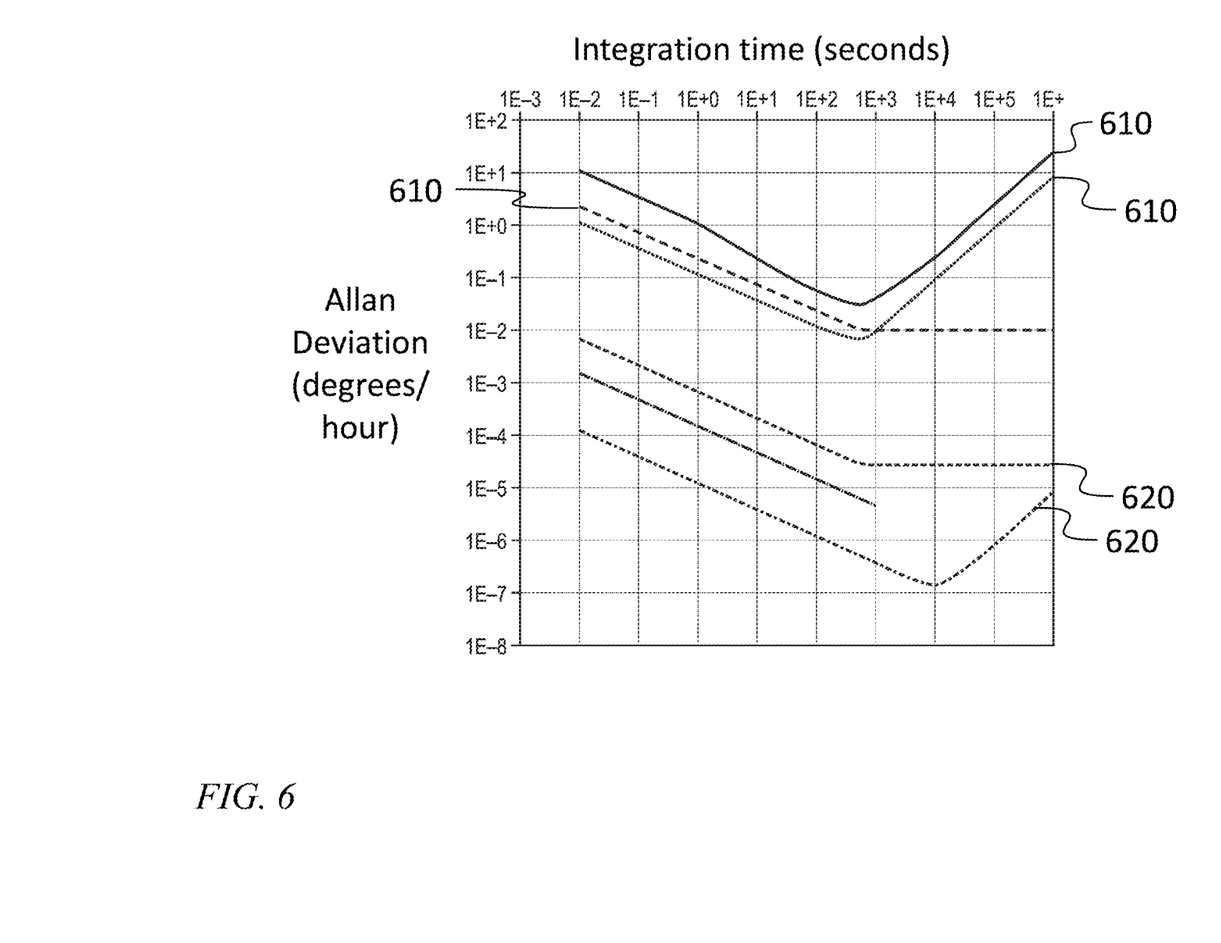
FIG. 6 is an Allan deviation chart of an angular sensor, according to an embodiment of the present invention.

Referring to FIG. 6, in one embodiment an improvement in stability may be characterized by a lower Allan deviation as a function of integration time, compared to related art embodiments not using a stable frequency reference. A family of first curves 610 corresponds to performance, measured in each case as an Allan deviation, that may be expected from related art systems operating without a stable frequency reference. Two second curves 620 define an envelope of improved performance curves that may be expected for a gyroscope employing embodiments of the present invention, for various grades of high stability frequency references.

Figure 7:
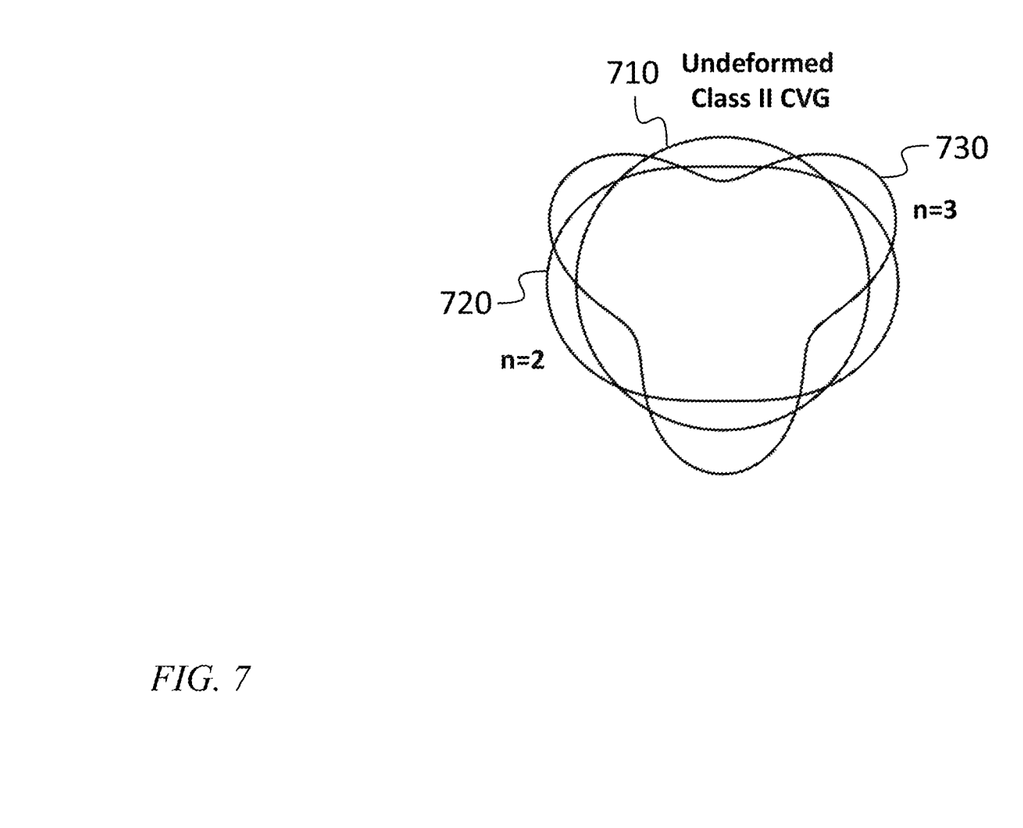
FIG. 7 is an illustration of normal modes with different mode numbers, according to an embodiment of the present invention.

In some embodiments, two pairs of nominally degenerate normal modes, e.g., a first pair each having a mode number of n=2, and a second pair each having a mode number of n=3, may be operated (i.e., driven and sensed) simultaneously or concurrently to provide an improvement in dynamic range. FIG. 7 shows an undeformed resonator 710, along with the shape 720 that it may take when deformed in the shape of an n=2 mode and the shape 730 that it may take when deformed in the shape of an n=3 mode.

Figure 8:
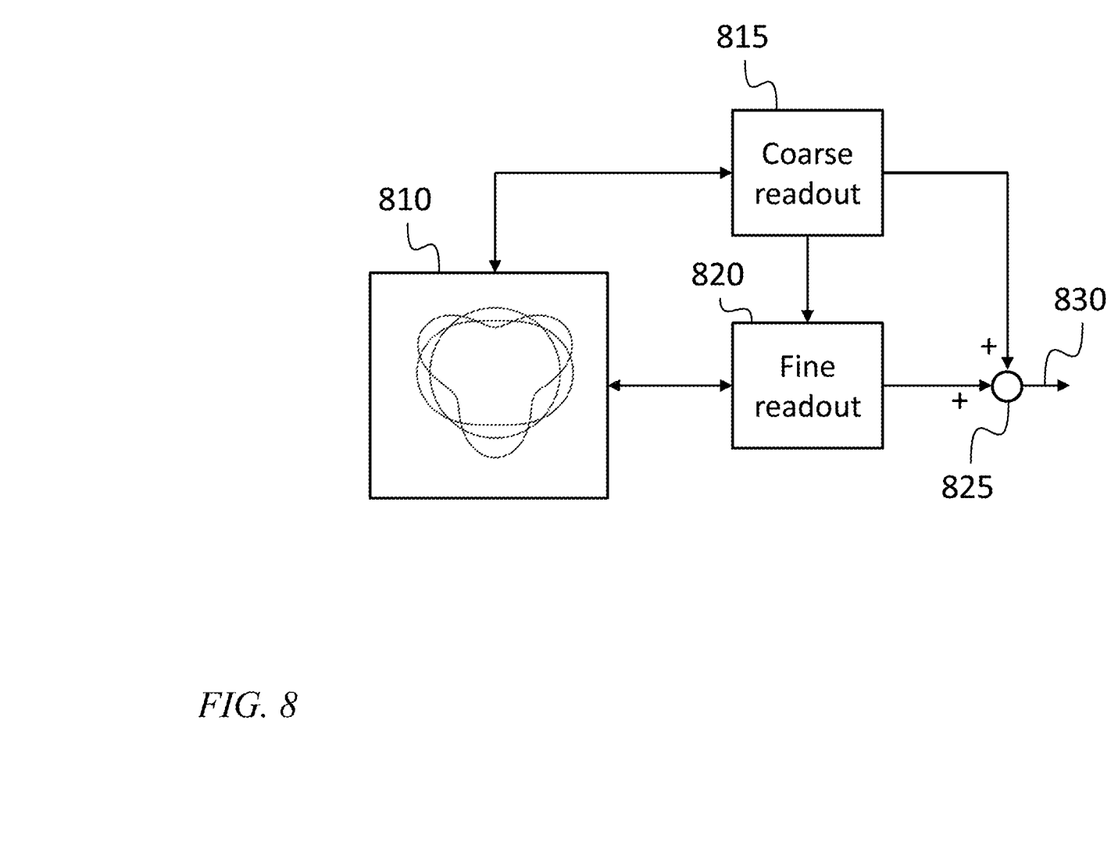
FIG. 8 is block diagram of a high stability, high dynamic range angular sensor, according to an embodiment of the present invention.

Referring to FIG. 8, in one embodiment a Coriolis vibratory gyroscope (CVG) includes a sensor head 810, a coarse readout circuit 815, a fine readout circuit 820 and a summing circuit 825, generating a high dynamic range signal at an output 830. For example, the first pair of normal modes (the n=2 modes) may be sensed by a coarse readout circuit 815 having a scale factor selected to allow the sensing circuitry to operate at rotation rates (for the DRG) of up to ±900 degrees per second. Here, the "scale factor" refers to the ratio of the rate-indicating output of the gyroscope (which may be an analog voltage or a digital number) to the rotation rate (e.g., in degrees per second). The selection of a scale factor suitable for operation at high angular rates (e.g., 900 degrees per second) may have the effect that the resolution of the gyroscope may be less fine than it would be if the scale factor were selected to accommodate only a smaller angular rate.

The rate-indicating output from the coarse readout circuit 815 may be fed, as an offset or bias, into the fine readout circuit 820 (which may drive and sense the second pair of normal modes, e.g., the n=3 modes), so that the output of the fine readout circuit 820 ranges only over a significantly smaller range of angular rates. For example, the system may include two copies of the readout circuit of FIG. 3, one operating as a coarse readout circuit and the other operating as the fine readout circuit. The rate-indicating output of the coarse readout circuit may then be (or be proportional to), for example, the phase error signal or the phase correction signal in the coarse readout circuit. In one embodiment, the scale factor for the second pair of modes is larger than that for the first pair of modes by a factor of approximately (about) $2^{19}$, i.e., a factor of approximately (about) 524,288, so that the second pair of modes is configured to sense angular rates with a magnitude of less than 0.002 degrees per second. Each readout circuit may include a respective frequency divider 340, with the factors by which the frequency is divided being selected so that the respective output frequencies of the two frequency dividers 340 correspond to the respective natural frequencies of the two pairs of normal modes.

Several methods may be employed to introduce an offset or bias into the fine readout circuit 820. In one embodiment, the output of the coarse readout circuit 815 is modulated, by a suitable analog or digital modulation circuit, to generate the signal expected at a point in the second control loop of the fine readout circuit 820, and the output of the modulation circuit is added to the signal from this point in the loop to generate a signal containing only a residual signal, corresponding to the difference between the angular rate and the coarse measurement of the angular rate generated by the coarse readout circuit 815. This signal may be suitable for being measured or calculated with substantially finer resolution than the output of the coarse readout circuit 815.

In another embodiment the output of the coarse readout circuit 815 may be used to adjust the respective drive frequencies of the modes of the fine readout circuit 820 (e.g., the n=3 modes), to introduce a bias that cancels a substantial portion of the signal, again leaving only a small residual signal suitable for being measured with substantially finer resolution than the output of the coarse readout circuit 815.

The techniques of embodiments of the present invention may be applied to other sensors such as accelerometers and magnetometers, e.g., using an external frequency reference to stabilize the control loops used to perform a readout operation of the desired quantity to be sensed by a MEMS resonator in a manner analogous to the readout of rotation rate in a MEMS CVG resonator. In these embodiments, there may be fewer or more total control loops employing the frequency stabilization concept. For example, an accelerometer or magnetometer may include a resonator having a natural frequency that is adjustable using a natural frequency control signal, e.g., by the application of a bias voltage to a tuning electrode. A stable frequency reference may be used to drive the resonator, and a phase difference between the drive signal and the motion of the resonator may be measured. A feedback signal derived from the difference between (i) the phase difference and (ii) a programmable phase target may be connected as a natural frequency control signal, tending to make the phase difference equal to the programmable phase target.

The techniques of embodiments of the present invention may be applied to a cluster of multiple sensors sharing a common frequency reference used for stabilizing the output signal. The cluster of sensors may be composed of sensors of varying types. For example, a stabilized 3 axis gyroscope cluster may be formed by 3 (or more) single axis gyroscopes arranged sharing a single stable frequency reference. An inertial measurement unit (IMU) may be formed by arranging 3 (or more) stabilized gyroscopes and 3 (or more) stabilized accelerometers sharing a single stable frequency reference. Finally, a complete IMU plus magnetic compass navigation sensor unit may be formed by arranging 3 (or more) stabilized gyroscopes, 3 (or more) stabilized accelerometers, and 3 (or more) stabilized magnetometers sharing a single stable frequency reference.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Any digital circuit employed in embodiments of the present invention, such as the digital control and synthesis circuit 352, may be implemented with a processor. The term "processor" is used herein to include any combination of hardware, firmware, and software, employed to process data or digital signals. Processing unit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs).

Although exemplary embodiments of a high stability angular sensor have been specifically described and illustrated herein, many modifications and variations will be apparent to those skilled in the art. Accordingly, it is to be understood that a high stability angular sensor constructed according to principles of this invention may be embodied other than as specifically described herein. The invention is also defined in the following claims, and equivalents thereof.

What is claimed is:
1. An angular sensor, comprising:
    a Coriolis vibratory gyroscope (CVG) resonator, configured to oscillate in a first normal mode and in a second normal mode;
    a frequency reference configured to generate a reference signal; and
    a first phase control circuit configured to:
        measure a first phase difference between:
            a first phase target, and
            the difference between:
                a phase of a mechanical oscillation of the first normal mode and
                a phase of the reference signal;
        apply a first phase correction signal to the CVG resonator, to reduce the first phase difference; and
    a second phase control circuit configured to:
        measure a second phase difference between:
            a second phase target, and
            the difference between:
                a phase of a mechanical oscillation of the second normal mode and
                the phase of the reference signal; and
        apply a second phase correction signal to the CVG resonator, to reduce the second phase difference,
    the angular sensor further comprising a first amplitude control circuit configured to:
        measure a first amplitude difference between:
            a first amplitude target, and
            the amplitude of the oscillation of the first normal mode, and
        apply a first amplitude correction signal to the CVG resonator, to reduce the first amplitude difference,
    the angular sensor further comprising a second amplitude control circuit configured to:
        measure a second amplitude difference between:
            a second amplitude target, and
            the amplitude of the oscillation of the second normal mode, and
        apply a second amplitude correction signal to the CVG resonator, to reduce the second amplitude difference,
    wherein the first amplitude control circuit, and the second amplitude control circuit are configured to interchange the values of the first amplitude target and the second amplitude target during operation.
2. The angular sensor of claim 1, wherein the first amplitude control circuit, and the second amplitude control circuit are configured to interchange the values of the first amplitude target and the second amplitude target repeatedly during operation.

* * * * *